(12) United States Patent
Lennartson et al.

(10) Patent No.: US 6,759,899 B2
(45) Date of Patent: Jul. 6, 2004

(54) CLASS-D AMPLIFIER WITH DIGITAL FEEDBACK

(75) Inventors: Lars Lennartson, Veberod (SE); Johan Nilsson, Lund (SE); Horst Knoedgen, Munich (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 0 days.

(21) Appl. No.: 10/277,502

(22) Filed: Oct. 22, 2002

(65) Prior Publication Data

US 2004/0066228 A1 Apr. 8, 2004

(51) Int. Cl.⁷ ................................................ H03F 3/38
(52) U.S. Cl. ..................................... 330/10; 330/207 A
(58) Field of Search ............................ 330/10, 207 A, 330/251; 375/238

(56) References Cited

U.S. PATENT DOCUMENTS 6,084,450 A    7/2000  Smith et al. ................. 327/172
6,373,334 B1 *  4/2002  Melanson ..................... 330/10
6,381,154 B1    4/2002  Nguyen ........................ 363/41
2002/0084843 A1 *  7/2002  Ruha ........................... 330/10

* cited by examiner

*Primary Examiner*—Steven J. Mottola
(74) *Attorney, Agent, or Firm*—George O. Saile; Stephen B. Ackerman

(57) ABSTRACT

A method for compensating for the pulse area error of a Class-D power amplifier is achieved; especially it compensates the variations in the supply voltage and similar dependencies. A Class-D Amplifier typically gets pulse coded digital input (PCM) and may comprise a Sigma Delta Modulator to generate the signals driving the power output stage, typically an H-Bridge. A fundamental idea of this invention is to measure the real area of the output pulses, where the area is defined as the pulse duration multiplied by the pulse voltage amplitude, and to compare it with the ideal nominal pulse area. The pulse area error is calculated and then subtracted from said amplifier's input data. Key element of this invention is the "Pulse Area Compensation Function", which calculates said real pulse area (voltage amplitude multiplied by time), compares said real pulse area with said ideal pulse area and feeds the difference into the input of said Sigma Delta Modulator.

28 Claims, 2 Drawing Sheets

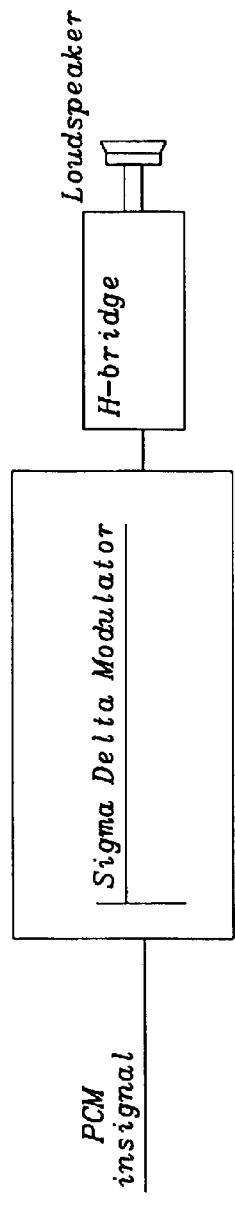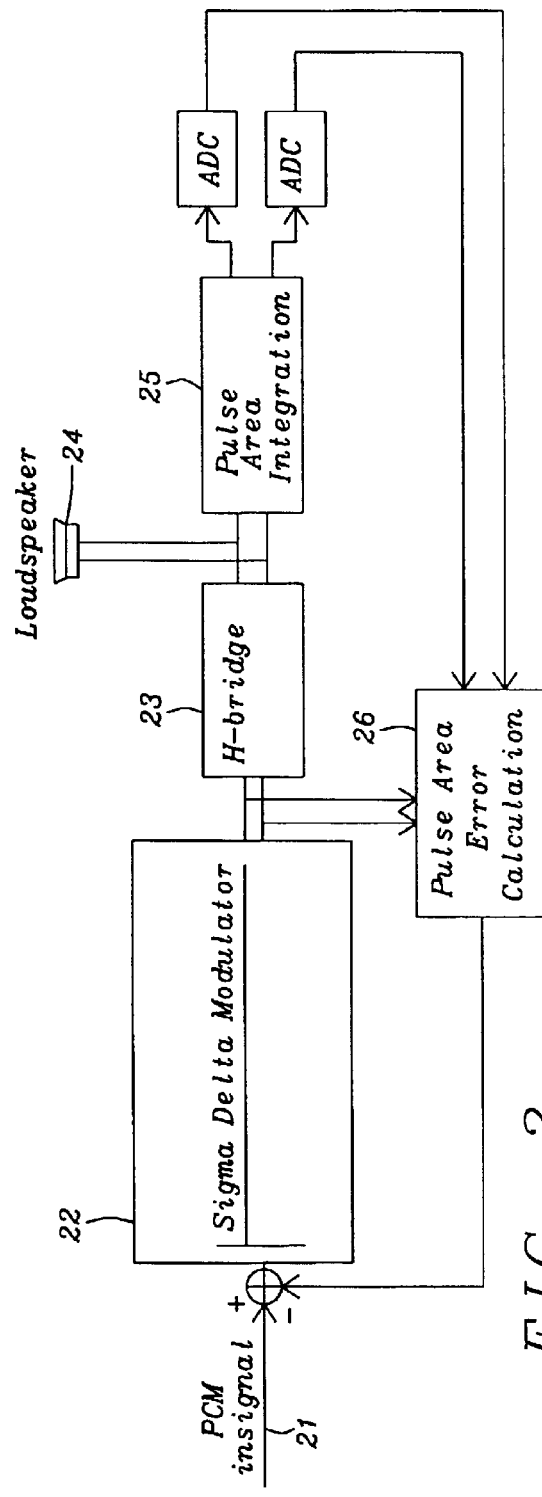

CLASS-D AMPLIFIER WITH DIGITAL FEEDBACK

BACKGROUND OF THE INVENTION

1. Field of the Invention

The invention relates to a Class-D Power Amplifier, and more particularly, to a Class-D Power Amplifier having a pulse coded digital input signal and typically using an H-Bridge to drive an output load, like a loudspeaker.

2. Description of the Prior Art

Class-AB amplifiers are notoriously inefficient; therefore in applications where thermal performance or battery life is important, a different amplifier topology is needed. Class-D amplifiers overcome the shortfalls of Class-AB amplifiers by being highly efficient. Class D refers to a design where the (unfiltered) output of an amplifier circuit always switches between the two extreme power supply voltage levels. With Class D amplifiers, the output is made to switch between the two output levels at a very high frequency—substantially higher than the highest audible frequency, which is done by feeding high-frequency pulses to the power amplification stage. The pulse-width ratio of the driving signal can be varied in order to make the averaged (filtered) output signal follow the (amplified) input signal very closely; such amplifier is referred to as pulse width modulated (PWM). The amplifier can also be pulse density modulated (PDM), were the density of pulses is varied in order to make the averaged (filtered) output signal follow the input signal. The output switching is controlled just by the pulse timing; and the output voltage at the load represents the input signal correct as long as the supply voltage is perfectly constant. However the amplitude of the switched voltage is in real life not fixed. Power supplies have a finite output impedance and tend to have ripple on them. Class D power stages per se have no power supply ripple rejection. Switch-induced ringing on the power supply and power stage similarly cause amplitude errors.

FIG. 1 shows a schematic block diagram of a state-of-the-art PDM Class-D Amplifier. It typically comprises a Sigma Delta Modulator, or a similar converter, to generate the driving signal for the power output stage, which is typically an H-Bridge and a loudspeaker.

Several patents describe the use of some form of digital feedback signal to compensate for errors in the output signal, however, none of them uses a method to measure the pulse area of the output signal and then calculating the required digital correction value in order to compensate for the error.

U.S. Pat. No. 5,949,282 (Nguyen, Huey, Takagishi, Hideto) discloses a circuit for, first, generating an accurate reproduction of the output of a Class D amplifier for error-correction purposes, and then, second, comparing the reference signal to the original signal input to the amplifier for error-correcting purposes.

U.S. Pat. No. 5,815,102 (Melanson and Laurence) describes, besides other methods, a digital to analog (D/A) converter, including a delta sigma modulator, that may implement a correction factor in at least one of its feedback loops to compensate for the characteristics of the output data from the duty cycle demodulator.

SUMMARY OF THE INVENTION

A principal object of the invention is to compensate for pulse error of a Class-D power output stage. A basic requirement is to compensate for the variations in the supply voltage and similar dependencies.

A fundamental idea is to measure the real area of the output pulses, where the area is defined as the pulse duration multiplied by the pulse voltage amplitude, and to compare it with the ideal nominal pulse area. The pulse area error is estimated and fed back into the Sigma-Delta-Modulator, which then is producing a different pattern than it should do without feedback.

In accordance with the objectives of this invention, a circuit for compensating for the pulse area error in a Class-D Amplifier, comprises a unit to convert the PCM (Pulse Code Modulated) input into time control pulses, controlling an output power driver, typically an H-Bridge. Said H-Bridge drives voltage into an output load, like a loudspeaker. Further said circuit comprises an integrator for the output pulses, a unit to measure the integrated output pulse area and a unit calculating the difference between the measured (real) pulse area and a given ideal pulse area. This pulse area error is subtracted from said PCM (Pulse Code Modulated) input signal.

Key element of this invention is the "Pulse Area Compensation Function", which calculates said real pulse area (voltage multiplied by time), compares said real pulse area with said ideal pulse area, then calculates the difference and feeds it into the Sigma Delta Modulator.

In accordance with the objectives of this invention, a method for compensating pulse area error in a Class-D Amplifier is implemented. First it converts the input stream of PCM pulses by the Sigma-Delta-Modulator into ideal H-Bridge control data pulses and applies them to the H-Bridge, which drives (switches) voltage to the output load (typically a loudspeaker). Then the real voltage pulses are measured at said H-Bridge output and the loudspeaker. Further, the real pulse area (voltage multiplied by time) is calculated and compared with the ideal pulse area, to determine the corresponding pulse area error. Said pulse area error is then subtracted from said PCM input signal at said Sigma Delta Modulator input.

In accordance with the objectives of this invention, a digital feedback circuit for compensating the pulse area error in a Class-D Amplifier is achieved. The circuit elements, building a "Pulse Area Compensation Function" may be distributed over several elements of the total Class-D Amplifier circuit. Said "Pulse Area Compensation Function" will comprise a circuit function to measure said integrated output pulse area, and a circuit function to calculate the difference between said measured (real) pulse area and a given ideal pulse area, which will then be subtracted from said PCM (Pulse Code Modulated) amplifier input signal.

In accordance with the objectives of this invention, said digital feedback circuit for compensating for the pulse area error in a Class-D Amplifier, building said "Pulse Area Compensation Function" might as well be combined as a single processing unit within said total Class-D Amplifier circuit. Said "Pulse Area Compensation Function" will again comprise a circuit function to measure said integrated output pulse area and a circuit function to calculate the difference between said measured (real) pulse area and a given ideal pulse area, which will then be subtracted from said PCM (Pulse Code Modulated) amplifier input signal.

BRIEF DESCRIPTION OF THE DRAWINGS

In the accompanying drawings, forming a material part of this description, there is shown:

FIG. 1 (Prior Art) shows the schematic block diagram for a prior art solution.

FIG. 2 shows the schematic block diagram for a solution, in accordance with an embodiment of this invention.

DESCRIPTION OF THE PREFERRED EMBODIMENTS

Figure 3:
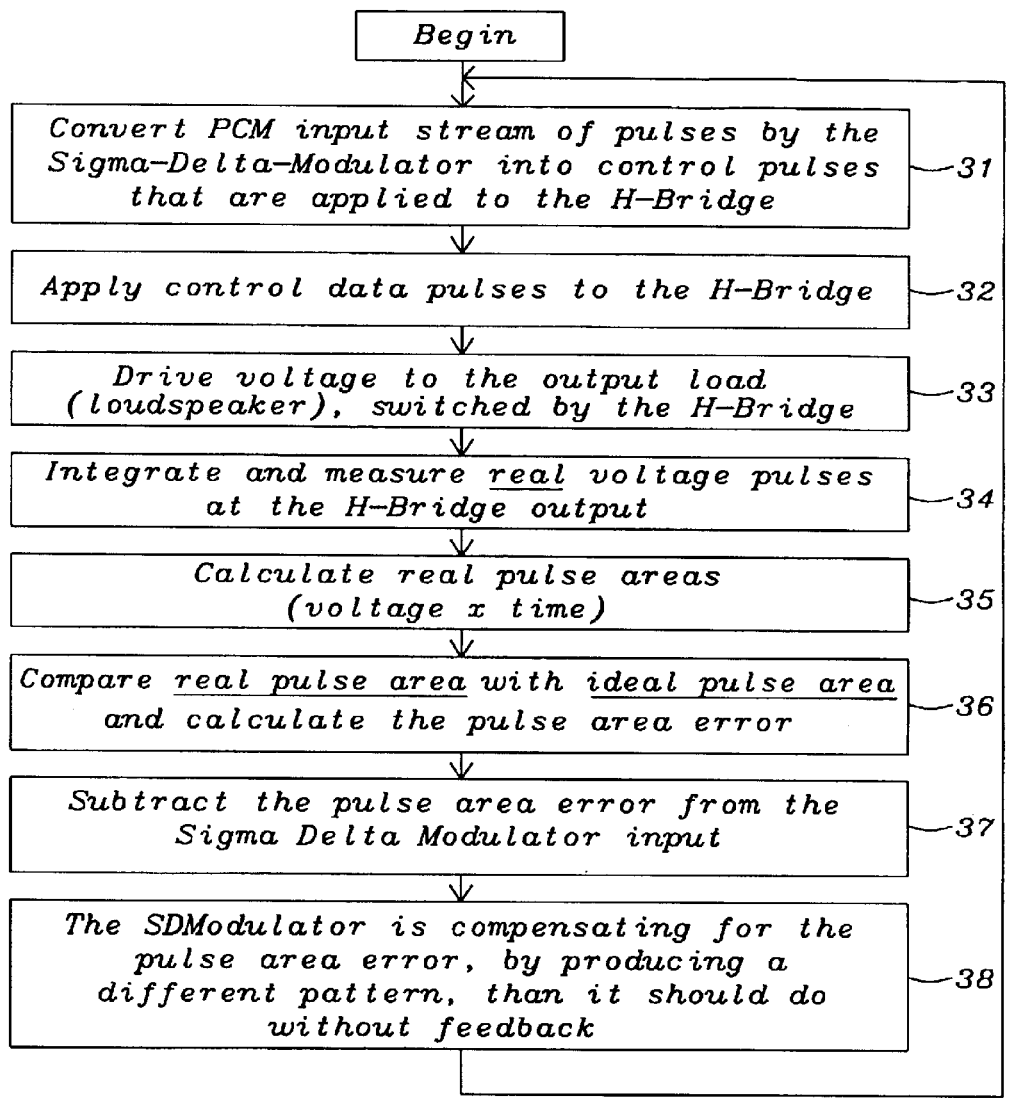
FIG. 3 shows a method for compensating the pulse area error in a Class-D Amplifier.

According to the objectives of the invention, to compensate for pulse error of a Class-D power output stage, especially to compensate for the variations in the supply voltage and similar dependencies, a digital "Pulse Area Compensation Function" is built into the circuit's feedback.

A fundamental idea of this invention is to measure the real area of the output pulses, where the area is defined as the time integral of the pulse voltage, and to compare it with the ideal nominal pulse area. Key element of this invention is the "Pulse Area Compensation Function", which calculates said real pulse area (time integral of the pulse voltage), compares said real pulse area with said ideal pulse area and then feeds it back into the Sigma Delta Modulator to compensate for said pulse area error.

FIG. 2 shows a schematic block diagram as disclosed in this invention. A digital "Pulse Area Compensation Function" is introduced into the feedback circuit.

A PDM Class-D Amplifier typically comprises a Sigma Delta Modulator (22) to generate the driving signal for the power output stage, which is typically an H-Bridge (23). First it converts the input PCM signal (21) by said Sigma-Delta-Modulator and applies them to the H-Bridge, which drives (switches) voltage to the output load (like a loudspeaker) (24). Then the real voltage pulses are measured at the H-Bridge output by the Pulse Area Integrator function (25). Further, the real pulse areas (time integral of pulse voltage) are compared with the ideal pulse area in the Pulse Area Error Calculation function (26). The said ideal pulse area is of fixed and a priori defined magnitude. The sign of the pulse is defined by the output of the Sigma Delta Modulator Finally the pulse area error is subtracted from said PCM input signal at said Sigma Delta Modulator input.

The method to achieve the objectives of this invention is illustrated in FIG. 3. First, in step 31, the PCM input signal is converted by the Sigma-Delta-Modulator into control pulses that are applied to the H-Bridge in step 32, which drives (switches) voltage to the output load, typically the loudspeaker, in step 33. Now, in step 34, the real voltage pulses are measured at the H-Bridge output and the pulse areas (voltage amplitude multiplied by time) are then calculated in step 35. Now said real pulse areas are compared with said ideal pulse areas, and the pulse area error is calculated; step 36. In step 37, the pulse area error is subtracted from the Class-D Amplifier at said Sigma Delta Modulator input. Finally, in step 38, the Sigma Delta Modulator is compensating for the pulse area error, by producing a different pattern, than it should do without feedback.

While the invention has been particularly shown and described with reference to the preferred embodiments thereof, it will be understood by those skilled in the art that various changes in form and details may be made without departing from the spirit and scope of the invention.

What is claimed is:

1. A circuit for compensating for the pulse area error in a Class-D Amplifier, comprising:

means to convert a PCM (Pulse Code Modulated) input into power driver control pulses;

means for a power driver to drive voltage into an output load, controlled by said control pulses;

means for an output load as the amplifier output target;

means to integrate the output pulse;

means to apriori know the ideal output pulse area;

means to measure the real output pulse area;

means to calculate said pulse area error, which is the difference between said measured (real) pulse area and said ideal pulse area; and means to subtract said pulse area error from said PCM (Pulse Code Modulated) signal.

2. The circuit of claim 1 wherein said means to convert the PCM (Pulse Code Modulated) input to control pulses is a Sigma Delta Modulator.

3. The circuit of claim 1 wherein said means for a power driver is an H-Bridge.

4. The circuit of claim 1 wherein said means for a power driver is a Half-Bridge.

5. The circuit of claim 1 wherein said means to determine said ideal pulse area take their reference signal from said Sigma Delta Modulator output.

6. The circuit of claim 1 wherein said means to integrate the output pulse is an integrated analog circuit.

7. The circuit of claim 1 wherein said means to measure the real output pulse area is implemented as an integrated analog circuit.

8. The circuit of claim 1 wherein said means to measure the real output pulse area is attached to the output of said means to integrate the output pulse.

9. The circuit of claim 1 wherein said means to integrate the output pulse is implemented as a calculating algorithm in a digital signal processor.

10. The circuit of claim 1 wherein said means to measure the integrated output pulse area is implemented as a calculating algorithm in a digital signal processor.

11. The circuit of claim 1 wherein said means to calculate the difference of said measured (real) pulse area and said ideal pulse area is implemented as a calculating algorithm in a digital signal processor.

12. A method for compensating the pulse area error in a Class-D Amplifier, comprising:

providing means to convert a PCM (Pulse Code Modulated) input into power driver control pulses, means for a power driver to drive voltage into an output load, means for an output load as the amplifier's output target, means to integrate the output pulse, means to measure the integrated output pulse area and to calculate the difference between said measured (real) pulse area and the ideal pulse area and means to subtract the difference from said PCM (Pulse Code Modulated) input signal;

converting PCM input signal into ideal power driver control pulses;

applying said power driver control pulses to said power driver;

driving voltage to the output load (loudspeaker), switched by said power driver;

integrating said real voltage pulses at the power driver's output;

measuring integrated pulse;

calculating real pulse area (voltage amplitude multiplied by time);

comparing real pulse area with apriori known ideal pulse area and calculate the difference; and subtracting the difference from said PCM input signal at said Sigma Delta Modulator.

13. The method of claim 12 wherein converting PCM input signal into ideal power diver control pulses is done by a Sigma Delta Modulator.

14. The method of claim 12 wherein an H-Bridge is used for driving voltage to the output load.

15. The method of claim 12 wherein a Half-Bridge is used for driving voltage to the output load.

16. The method of claim 12 wherein the reference signal to determine said ideal pulses is taken from said Sigma Delta Modulator output.

17. The method of claim 12 wherein integrating said real voltage pulses is performed by an integrated analog circuit.

18. The method of claim 12 wherein measuring integrated pulse is implemented as an integrated analog circuit.

19. The method of claim 12 wherein integrating said real voltage pulses is implemented as a calculating algorithm in a digital signal processor.

20. The method of claim 12 wherein measuring said integrated pulses area is implemented as a calculating algorithm in a digital signal processor.

21. The method of claim 12 wherein calculating said real pulse area is implemented as a calculating algorithm in a digital signal processor.

22. The method of claim 12 wherein calculating the difference of said measured (real) pulse area and said ideal pulse area is implemented as a calculating algorithm in a digital signal processor.

23. A circuit for digital feedback in a Class-D Amplifier, to compensate for the pulse area error, building a "Pulse Area Error Compensation Function", is distributed over several functional elements in the circuit, comprising means to determine the ideal output pulse area;

means to integrate the output pulse area;

means to measure the integrated output pulse area;

means to calculate the difference between said measured (real) pulse area and said ideal pulse area; and means to subtract said difference from a PCM (Pulse Code Modulated) input signal.

24. The circuit of claim 23 wherein said means to integrate the output pulse area use an analog integrator.

25. The circuit of claim 23 wherein said means to measure the integrated output pulse area use an analog to digital converter.

26. A circuit for digital feedback in a Class-D Amplifier, to compensate for the pulse area error, is implemented in a single functional unit, building a "Pulse Area Error Determination and Processing Unit", comprising means to determine the ideal output pulse area;

means to integrate the output pulse area;

means to measure the real output pulse area; and means to calculate the difference between said measured (real) pulse area and said ideal pulse area.

27. The circuit of claim 26 wherein said single functional unit, building a "Reference Area and Preprocessing Unit", is implemented within a digital signal processor.

28. The circuit of claim 26 wherein said single functional unit, building a "Pulse Area Error Determination and Processing Unit", also includes said means to subtract said difference from a PCM (Pulse Code Modulated) input signal.

* * * * *